United States Patent
Smith

Patent Number: 5,925,167
Date of Patent: Jul. 20, 1999

[54] PROCESSES FOR THE SCRUBBING OF NOXIOUS SUBSTANCES

[75] Inventor: James Robert Smith, Blackford, United Kingdom

[73] Assignee: The BOC Group plc, Windlesham, United Kingdom

[21] Appl. No.: 08/892,385

[22] Filed: Jul. 14, 1997

[30] Foreign Application Priority Data

Jul. 15, 1996 [GB] United Kingdom ............... 96114849

[51] Int. Cl.$^6$ .................................................. B01D 47/00
[52] U.S. Cl. ............................ 95/11; 55/385.1; 55/418;
95/149; 96/264; 96/379; 96/399; 438/905;
438/909
[58] Field of Search ..................... 95/11, 43, 95,
95/284, 288, 149; 96/4.111, 108, 243, 264,
397, 399, 379; 55/385.1, 385.2, 418, 419,
261, 266, 269, 274, 212, 210; 454/187;
438/905, 906, 909

[56] References Cited

U.S. PATENT DOCUMENTS

| | | | |
|---|---|---|---|
| 4,704,951 | 11/1987 | Pruchon | 55/385.2 |
| 4,877,429 | 10/1989 | Hunter | 95/95 |
| 5,043,299 | 8/1991 | Chang et al. | 438/905 |
| 5,122,170 | 6/1992 | Satoh et al. | 55/385.2 |
| 5,350,336 | 9/1994 | Chen et al. | 55/385.2 |
| 5,584,963 | 12/1996 | Takahashi | 438/905 |
| 5,626,820 | 5/1997 | Kinkead et al. | 55/385.2 |

FOREIGN PATENT DOCUMENTS

| | | |
|---|---|---|
| 0 819 779 A1 | 1/1988 | European Pat. Off. |
| 44 17 205 A1 | 2/1994 | Germany . |
| 55-018024 | 7/1980 | Japan . |
| 07029841 | 1/1995 | Japan . |
| 663 549 | 12/1987 | Switzerland . |

*Primary Examiner*—Duane S. Smith
*Attorney, Agent, or Firm*—David M. Rosenblum; Salvatore P. Pace

[57] ABSTRACT

A method for the scrubbing of noxious substances from an exhaust gas stream from an evacuated process chamber containing a tool for the processing of semiconductor devices. The method comprises directing the stream from the chamber in to a duct containing a multi-way valve and selectively adjusting the valve to cause different fractions of the stream to be directed to relevant treatment/collection/exhaust points.

14 Claims, 2 Drawing Sheets

PROCESSES FOR THE SCRUBBING OF NOXIOUS SUBSTANCES

BACKGROUND OF THE INVENTION

This invention relates to the scrubbing of noxious substances from exhaust gas streams, particularly those found in the semiconductor industry.

Large quantities of noxious substances are employed in the semiconductor industry in the processing of electronic wafers/chips and other devices. In the case of plasma enhanced chemical vapour deposition (PECVD) in particular, process gases including silane, TEOS, phosphine and dichlorosilane are used in turn between the different process stages in the same process chamber held under vacuum by vacuum pumps.

Between the stages, cleaning steps are required for the process tools and these are commonly effected using perfluorocarbon (PFC) gases. The cleaning steps tend to use a relatively small proportion of the PFC gases and the unused proportion is discharged to the exhaust duct from the process chamber.

Both the process gases and the cleaning gases are evacuated from the process chamber in turn via the same exhaust system and generally need to be scrubbed from the exhaust gas stream so that it is rendered harmless before passing to the atmosphere. A variety of different types of scrubbing equipment has been attached to exhaust systems for this purpose.

It is normal practice in the semiconductor industry to add considerable amounts of nitrogen gas to the exhaust stream being passed through the vacuum pumps to assist the pumping operation itself and to dilute any pyrophoric gases present in the exhaust stream to below their threshold limit of combustion. In addition it is generally deemed expedient in the semiconductor industry that the unused PFC gases are destroyed or recovered but the dilution with nitrogen renders it more expensive and difficult to treat or recover the unused PFC gases in the exhaust stream.

There is therefore a need to provide an improved method for the efficient scrubbing of such exhaust gas streams coupled with an ability to treat or recover unused PFC gases.

SUMMARY OF THE INVENTION

In accordance with the invention, there is provided a method for the scrubbing of noxious substances from an exhaust gas stream from an evacuated process chamber containing a tool for the processing of semiconductor devices, the method comprising directing the stream from the chamber in to a duct containing a multi-way valve and selectively adjusting the valve to cause different fractions of the stream to be directed to relevant treatment/collection/exhaust points.

The multi-way valve should be at least a three-way valve but may be more than three-way to reflect the number of required treatment/collection/exhaust points to the atmosphere or elsewhere.

In a first embodiment, the multi-way valve can be positioned so that the exhaust gas stream passes through a vacuum pump used for evacuating the process chamber prior to its being directed to the multi-way valve. In an alternative embodiment, the multi-way valve can be positioned such that the exhaust gas stream passes directly to the valve prior to its being directed to a vacuum pump or pumps.

Preferably, the multi-way valve is positioned such that the exhaust gas stream passes through a high throughput vacuum pump, for example a Roots blower, prior to entering the multi-way valve. Also preferably the exhaust stream thereafter is passed to a further vacuum pump or pumps associated with the system in to which the multi-way valve directs the different fractions exiting the valve. As such the method of the invention can be used to ensure that the valve diverts and separates the relevant exhaust gas stream components prior to the stream passing through the further vacuum pump. Different types of vacuum pump or different specifications of pump may be therefore employed to suit the respective fractions separated by the valve, ie heavier duty pumps for the more aggressively toxic fractions and lighter duty ones for the less toxic fractions. In addition, the pumps may be individually suited to the pumping of the more volatile or more pyrophoric fractions or whatever. In particular, the multi-way valve may be employed to good effect in order to treat, for example chemically, one or more fractions and to collect one or more other reusable or recyclable fractions.

In the case of exhaust streams passing through a multi stage dry vacuum pump in particular, the pump will increasingly compress the exhaust gas stream as it passes through the different stages until it reaches the normal discharge pressure of approximately one atmosphere at the pump outlet. It is normal practice only to dilute these gases in the final stage or stages of the pump with diluent, inert gases such as nitrogen.

However, in further preferred embodiments of the invention, the method includes the positioning of the multi-way valve in an inter-stage position of a multi-stage vacuum pump, for example such that the gas stream is directed by the valve from a selected intermediate stage of the pump either away from the pump or is directed back in to the same or a subsequent stage of the pump. Switching of the valve will allow preselected fractions of the gas stream to be directed in the desired manner.

For example, the multi-way valve may be positioned to receive the gas stream as it exits the third stage of a multi-stage pump or as it exits the penultimate stage of a three or four stage pump and either direct it away from the pump or direct it back in to the same or the subsequent stage of the pump as described above.

Such further preferred embodiments therefore allow, for example, gases in a fraction of the exhaust stream not requiring dilution with an inert gas to be directed away from the pump and gases in a separate fraction of the exhaust stream requiring dilution with an inert gas to be directed back in to the same or the subsequent stage of the multi-stage pump and for diluent gas to be introduced in that same or (preferably) the subsequent stage of the pump. Indeed it is preferred that any additions of inert gases to the pumps are terminated during the period of time when certain gases are present allowing them to be diverted with minimum dilution.

Even without the presence of a multi-stage pump in the exhaust system, dilution of only certain selected fractions of the gas stream with inert gas is possible after the stream has been separated in to different fractions by use of the multi-way valve system of the invention.

In certain cases, it may be preferred in a system incorporating a multi-stage pump and a multi-way valve at an inter-stage position of the pump for diluent inert gas to be introduced in to one or more stages before the stage in which separation of the exhaust stream occurs in addition to the possibility of introducing an inert gas in a stage after a selected fraction has been returned after separation by the valve. However, in such cases, it is important that the inert gas flow in to the stage(s) before separation is stopped prior to the presence in the exhaust stream at the pump inlet of the fraction or species which it is intended to recover or recycle after it has been diverted from the pump by means of the multi-way valve.

It is preferred that, whether or not the exhaust gas stream passes through a vacuum pump prior to entering the multi-way valve, each of the different fractions exiting the multi-way valve (depending on the positioning of that valve) in the manner described above are passed to a further vacuum pump. Advantageously, the further vacuum pump (or pumps) in such further preferred embodiments receive the same selected exhaust gas fraction from different diverting arrangement within the same or different systems.

It is advantageous for the method of the invention to be applied to a multi-exhaust semi-conductor system, for example a system having a number, say twenty, of process chambers. In such a system, the different exhausts may each be directed to a single multi-way valve of the invention or, more preferably, each exhaust may be directed to a dedicated vacuum pump before subsequently being directed to the multi-way valve. Alternatively, it may well be advantageous for each exhaust to have a dedicated vacuum pump and a dedicated multi-way valve. Thereafter it may be advantageous for the same (or similar) exhausts from the different chambers to be directed to a common (or "house") line which is preferably backed by a single further vacuum pump.

In such multi-exhaust systems, the method of the invention allows fractions of the gas of the different exhausts to be separated from other fractions by means of the multi-way valve so that different fractions may collectively be treated or collected in the most expedient manner.

Also in such multi-exhaust systems, the use of a dedicated multi-stage vacuum pump for each exhaust is preferred in which a multi-way valve is present at an inter-stage position.

In such systems it is advantageous for one or more of the same (or similar) fractions from the individual exhausts to be directed from the dedicated multi-stage pump of each exhaust by means of the multi-way valve in to a common (or "house") line backed by a single further vacuum pump for the whole line.

Advantageously, one fraction containing certain gas(es) of the exhaust can be passed along the house line for the end purpose, for example, of recovering one or more gases of that fraction and the other fraction containing certain gas(es) of the exhaust can be passed back in to the multi-stage pump for the end purpose, for example, of converting one or more gases of that other fraction in to non-toxic species, for example in a wet or dry scrubber or in a thermal processing unit, or vice versa.

In certain preferred embodiments, the fraction being recovered can advantageously be directed through a pre-scrubber, preferably positioned after the further vacuum pump, in which certain unwanted species of the fraction can be removed prior to recovery of other species of the fraction.

The pre-scrubber may be a simple aqueous bath or may be a more complicated system.

The recovery apparatus may be of any type suitable for the species in question to be recovered including cryogenic condensation means, membrane separation means and pressure/vacuum swing means.

Particularly important species needing recovery for economic and for environmental reasons include the various PFC gases including tetrafluromethane and hexafluroethane.

In general, the gases present in the process chamber are those used in the semiconductor processing and those use for cleaning the tool and/or the semiconductor devices being prepared and the individual gases will therefore tend to be exhausted as fractions from the chamber in turn.

The control of the introduction of the individual gases in to the process chamber and therefore their evacuation therefrom will generally be controlled by the process tool. In preferred embodiments, therefore the adjustment of the multi-way valve is effected by a signal from the process tool.

Alternatively, the adjustment of the multi-way valve is effected by a signal from a gas detection means for identifying different gas components in the exhaust stream. Such gas detection means can comprise one or more sensors located in or near the process chamber, preferably in the exhaust duct leading from the chamber.

The use of an inert diluent gas, commonly nitrogen, is also commonly relevant to one or more of the fractions of the exhaust gas stream. Advantageously, the signal from the process tool or from the gas detection means also causes a flow of diluent inert gas through the vacuum pump.

BRIEF DESCRIPTION OF THE DRAWINGS

For a better understanding of the invention, reference will now be made, by way of exemplification only, to the accompanying drawings, in which.

DETAILED DESCRIPTION

Figure 1:
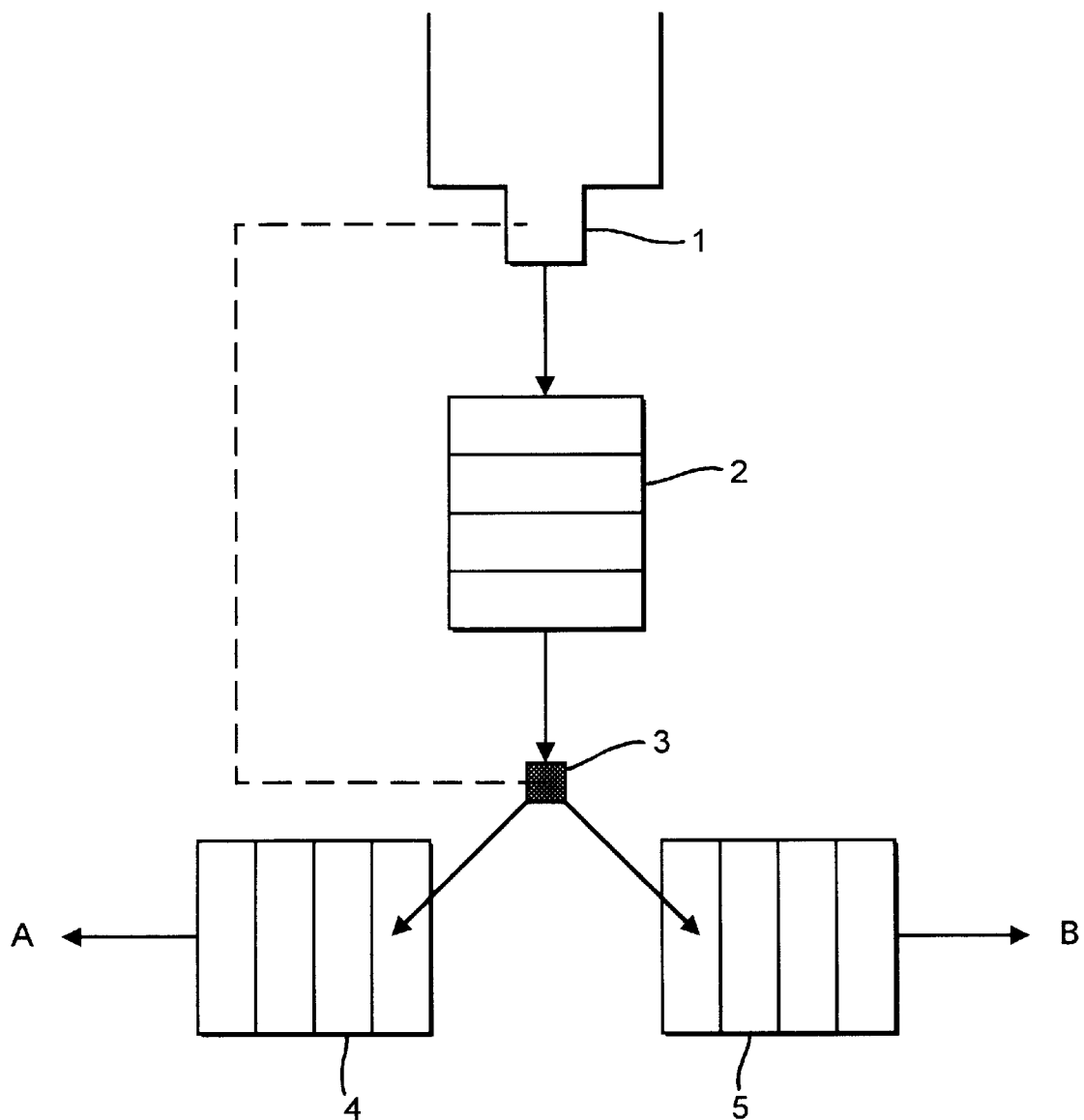
FIG. 1 shows a schematic layout of a simple method of the invention employing a multi-way valve positioned between a first vacuum pump and subsequent vacuum pumps.

With reference to FIG. 1, there is shown in simplified form apparatus for carrying out a method of the invention comprising a semi-conductor processing chamber 1 and a four-stage dry vacuum pump 2 of construction well known per se in to which exhaust gases can be drawn from the chamber 1.

At the outlet of the vacuum pump 2 is positioned a three-way valve 3 which, depending on its setting, causes the exhaust gases entering the valve 3 at a pressure between that of the chamber 1 and atmospheric pressure to be drawn in to either a first further vacuum pump 4 or a second further vacuum pump 5. Gases exiting the pumps 4 and 5 in the general direction shown by the arrows A and B can then be treated or collected in the most expedient manner.

The apparatus includes means for allowing a process tool (not shown) in the chamber 1 to control the positioning of the valve 3 so that the valve adopts the correct position when different exhaust fractions are detected as they exit the chamber 1 and proceed to the valve 3 via the vacuum pump 2.

Figure 2:
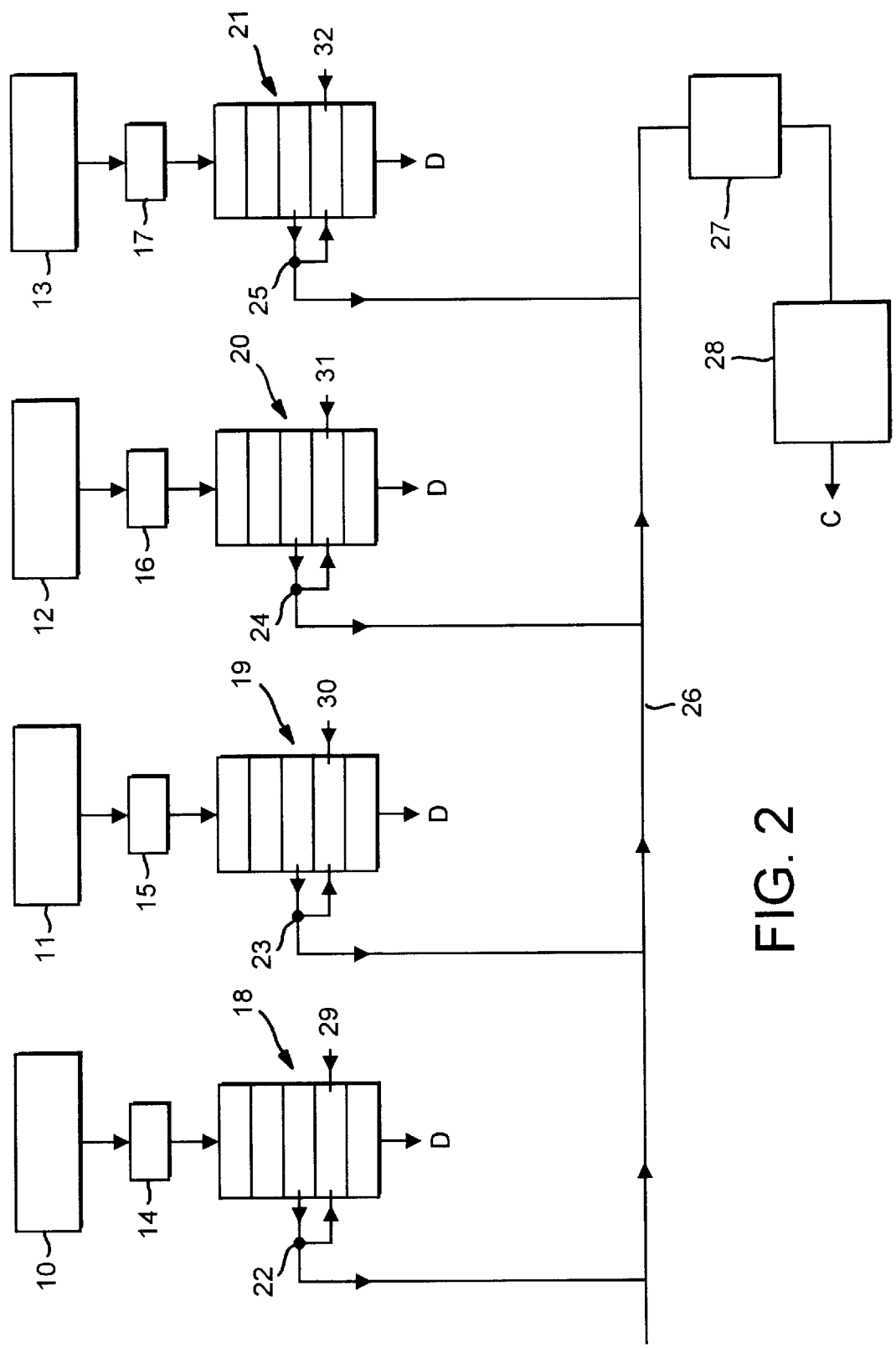
FIG. 2 shows a schematic layout of a further method of the invention applied to a multi-chamber semi-conductor processing system and using a common fraction collating arrangement.

Turning to FIG. 2, there is shown a more complicated apparatus for carrying out a method of the invention, comprising a number of semi conductor processing chambers of which four chambers are shown 10, 11, 12, 13 exhaust gases from which are drawn in to associated high throughput, single stage Roots dry vacuum pumps 14, 15, 16, 17 respectively.

Exhaust gases exiting the pumps 14, 15, 16, 17 then pass to the respective inlets of five stage mixed Roots/Claw dry vacuum pumps 18, 19, 20, 21, the stages being shown for each pump in FIG. 2.

The gases exit at the third stage outlets via an inter-stage exit port and pass to respective three-way valves 22, 23, 24, 25.

With the valves 22, 23, 24, 25 in a first position, the exhaust gases are not returned to the pumps 18, 19, 20, 21 but pass in to a common "house" line 26 backed by another vacuum pump 27 sized to accommodate the exhausts from all the processing chambers and thence to a scrubbing/recovery unit 28. The resulting gases pass out of the system as shown by arrow C.

With the valves 22, 23, 24, 25 in a second position, the exhaust gases are returned to the pump via a further inter-stage port in to the fourth stage and then pass to the outlet of the pump at the fifth stage as shown by the arrows D.

The gases passing out of the pumps in this way may be collectively or individually treated or passed to the atmosphere depending on the type of gas(es) contained in the fraction of the exhaust stream directed out of the system in this way.

If appropriate, a purge gas, such as nitrogen, can be introduced in to the vacuum pumps 18, 19, 20, 21 to assist pumping and to aid treatment of the exhaust gases. In preferred embodiments, the purge gas is introduced after the exhaust stream has been separated by the multi-way valve, for example in to the fourth stage of the five stage pump as shown in FIG. 2 as shown by the arrows 29, 30, 31, 32.

There is also the possibility (not shown in the drawings) of introducing a purge gas in to the second and/or third stages of the pumps 18, 19, 20, 21 but means should be provided to stop this flow of purge gas via these stage(s) once a gas fraction or species which it is desired to direct in to the line 26 by means of the valves 22, 23, 24, 25 has been identified in the exhaust stream leaving the chamber 10, 11, 12, 13.

As with the apparatus of FIG. 1, means are provided to allow the process tools (again not shown) in the respective chambers 10, 11, 12, 13 to control the positioning of the valves 22, 23, 24, 25 respectively so that the difficult fractions of the exhaust streams can be directed in the most expedient manner.

In use of a system of the type shown in FIG. 2, it is clearly advantageous for the exhaust cycles of the different gas from each chamber 10, 11, 12, 13 to be operated synchronously so that positioning of the three-way valve may also be synchronous and the same fractions from the different chambers pass simultaneously in to the common conduit 26. In certain embodiments, the gases being returned to the fourth chamber of the vacuum pumps 16, 17, 18, 19, 20, 21 will be inert, non-toxic gases such as nitrogen diluent gas requiring no special treatment or collection means.

As an example of the use of the apparatus shown in FIGS. 1 and 2, especially with reference to FIG. 2, a first PECVD or etching process in the chamber 10, 11, 12, 13, usually synchronously, may produce a first exhaust stream fraction comprising predominantly silane ($SiH_4$) and ammonia ($NH_3$) with a second (cleaning) process in the chambers may produce a second exhaust stream fraction comprising predominantly tetrafluoromethane ($CF_4$) and hexafluoroethane ($C_2F_6$) together with oxygen.

In a method of the invention, the first fraction may usefully be directed by the three way valves 22, 23, 24, 25 back in to the pumps 18, 19, 20. 21 and exiting therefrom (in the direction of arrows D) and, thereafter, for destruction of the gases in, for example, a thermal processing unit. Introduction of a purge flow of nitrogen gas via the arrows 29, 30, 31, 32 will assist and is necessary for this purpose.

The second fraction may usefully be directed by the other setting of the three way valves 22, 23, 24, 25 in to the common "house" line 26 and in to the vacuum pump 27 and finally in to the scrubbing/recovery unit 28. Although not shown in FIG. 2, a pre-scrubber may be used between the pump 27 and the scrubbing/recovery unit 28 for the purpose of removing species such as $SiF_4$, HF, $F_2$, CO, $CO_2$, $H_2O$.

The scrubbing/recover unit 28 can usefully comprise one (or more) of a membrane separation unit, a pressure (or vacuum) swing separation unit or a selective cryogenic separation unit all generally known per se and not of specific relevance to this invention.

However, it should be noted that the use of a method of the invention utilising a multi-way valve allows for a nitrogen purge to be used for one fraction where it is necessary but not to be used for another fraction. In this particular example, the lack of purge gas in the PFC fraction has been found to allow for a much better recovery efficiency of the valuable and environmentally harmful PFCs than would be the case if a nitrogen purge had been used.

We claim:

1. A method for the scrubbing of noxious substances from an exhaust gas stream having a varying composition from an evacuated process chamber containing a tool for the processing of semiconductor devices, the method comprising;
    directing the exhaust stream from the process chamber into a duct containing a multi-way valve; and
    selectively adjusting the multi-way valve to cause different fractions of the varying composition of the stream to be directed, in dependence upon a specific fraction, to a treatment point in which the noxious substances are scrubbed from the exhaust gas stream and at least one of another treatment point, a collection point, and an exhaust point.

2. The method according to claim 1 in which the multi-way valve is a three-way valve.

3. The method according to claim 1 in which the exhaust gas stream passes through a vacuum pump used for evacuating the process chamber prior to its being directed to the multi-way valve.

4. The method according to claim 1 in which the multi-way valve is positioned such that the exhaust gas stream passes directly to the valve prior to its being directed to a vacuum pump.

5. The method according to claim 1 in which the exhaust gas stream passes through a high throughput vacuum pump prior to entering the multi-way valve and is thereafter passed to a further vacuum pump in to which the multi-way valve directs the different fractions exiting the valve.

6. The method according to claim 4 in which the multi-way valve is positioned in an inter-stage position of a multi-stage vacuum pump.

7. The method according to claim 7 in which the multi-way valve directs the gas stream from a selected intermediate stage of the pump either away from the pump or back in to the same or a subsequent stage of the pump.

8. The method according to claim 1 in which a diluent gas is added to only certain selected fractions of the gas stream separated by the multi-way valve.

9. The method according to claim 1 which is applied to a multi-exhaust semi-conductor system.

10. The method according to claim 9 in which each exhaust is directed to a dedicated vacuum pump and a dedicated multi-way valve.

11. The method according to claim 10 in which one or more of the same fractions from the individual exhausts are directed from the dedicated vacuum pump of each exhaust by means of the multi-way valve in to a common line backed by a further vacuum pump for the whole line.

12. The method according to claim 1 in which the adjustment of the multi-way valve is effected by a signal from the process tool.

13. The method according to claim 1 in which the adjustment of the multi-way valve is effected by a signal from a gas detection means for identifying different gas components in the exhaust stream.

14. The method according to claim 12 in which the signal from the process tool also causes a flow of diluent inert gas through a vacuum pump.

* * * * *